(12) United States Patent
Song et al.

(10) Patent No.: US 8,216,635 B2
(45) Date of Patent: Jul. 10, 2012

(54) METHOD OF FORMING METAL WIRING AND METAL WIRING FORMED USING THE SAME

(75) Inventors: Young Ah Song, Gyunggi-do (KR); Young Chang Joo, Seoul (KR); Ji Hoon Lee, Seoul (KR); Seol Min Yi, Seoul (KR); Jae Woo Joung, Gyunggi-do (KR); Sung Il Oh, Seoul (KR); Tae Hoon Kim, Gyunggi-do (KR); In Young Kim, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 497 days.

(21) Appl. No.: 12/503,491

(22) Filed: Jul. 15, 2009

(65) Prior Publication Data
US 2010/0196681 A1 Aug. 5, 2010

(30) Foreign Application Priority Data
Feb. 3, 2009 (KR) .................. 10-2009-0008492

(51) Int. Cl.
*B05D 5/12* (2006.01)
*B05D 3/00* (2006.01)

(52) U.S. Cl. ....... 427/98.4; 427/190; 427/192; 427/197; 427/282; 427/294; 427/379; 427/421.1

(58) Field of Classification Search .................. 427/98.4, 427/190, 192, 197, 379, 383.1, 282, 294, 427/421.1
See application file for complete search history.

(56) References Cited

U.S. PATENT DOCUMENTS

| 7,968,008 | B2 * | 6/2011 | Parashar et al. ............... 252/500 |
| 2006/0210705 | A1 | 9/2006 | Itoh et al. |

FOREIGN PATENT DOCUMENTS

| JP | 10-294018 | 11/1998 |
| JP | 10-308119 | 11/1998 |
| JP | 2004-119686 | 4/2004 |
| JP | 2007-262446 | 10/2007 |
| JP | 2008-176951 | 7/2008 |
| KR | 10-2006-0117169 | 11/2006 |
| KR | 10-0753468 | 8/2007 |
| WO | 2004/103043 A1 | 11/2004 |

OTHER PUBLICATIONS

Korean Office Action issued Oct. 5, 2010 in corresponding Korean Patent Application 10-2009-0008492.
Japanese Office Action issued Jul. 19, 2011 in corresponding Japanese Patent Application 2009-160057.

* cited by examiner

*Primary Examiner* — Brian K Talbot

(57) ABSTRACT

Disclosed are a method of forming metal wiring and metal wiring formed using the same. The method includes printing wiring using an ink composition including metallic nanoparticles and dispersants maintaining dispersion of the metallic nanoparticles, performing a first firing process of firing the wiring under vacuum or in an inert atmosphere to suppress grain growth, and performing a second firing process of firing the wiring with the vacuum or inert atmosphere released, to accelerate grain growth. The method of forming metal wiring induces abnormal grain growth by rapidly removing dispersants, capable of inducing the growth of metallic nanoparticles, at a temperature at which the growth force of the metallic nanoparticles is high, in the process of firing the metallic nanoparticles. Accordingly, the metal wiring has a coarse-grained structure containing metallic particles with a large average particle size, and the electrical and mechanical characteristics thereof can be enhanced.

9 Claims, 5 Drawing Sheets

METHOD OF FORMING METAL WIRING AND METAL WIRING FORMED USING THE SAME

CROSS-REFERENCE TO RELATED APPLICATIONS

This application claims the priority of Korean Patent Application No. 2009-0008492 filed on Feb. 3, 2009, in the Korean Intellectual Property Office, the disclosure of which is incorporated herein by reference.

BACKGROUND OF THE INVENTION

1. Field of the Invention

The present invention relates to a method of forming metal wiring and metal wiring formed using the same, and more particularly, to a method of forming metal wiring and metal wiring formed using the same, which can improve electrical and mechanical properties.

2. Description of the Related Art

As electronic devices and information terminal devices have become smaller and lightweight, electronic components mounted in such devices have also been reduced in size. This requires wiring patterns for mounting inside electronic components to have smaller sizes and widths and smaller spacing between the wiring patterns.

An optical patterning method based on exposure and etching is in common use to form high-resolution patterns for electronic devices. However, this optical patterning method is wasteful of materials and requires complicated multistage processes due to the use of photoresist, developer or etching solution for example, thus imparing process efficiency. Moreover, a large mask needs to be used in the optical patterning process, and this makes it difficult to quickly apply a new design to a production line. In order to overcome those limitations of the optical patterning, an inkjet printing method has been developed that allows the formation of patterns directly on a substrate without using a mask while minimizing the number of processes and the material consumption.

The inkjet printing method may substitute for the optical patterning method, and is an eco-friendly technique, unlike the existing optical patterning. The inkjet printing method is currently under development in various corporations, schools and institutes. The inkjet printing method is expected to significantly contribute to saving production costs in the fields of electronic/electric components and displays.

The inkjet printing method is widely applicable because it allows any material, which can be made into ink, to be printed selectively and rapidly as fine patterns. In the process of inkjet printing, ink is sprayed onto a target position in a non-contact manner. For this reason, shapes can be freely printed on a substrate such as paper, fabrics, metal, ceramics or polymer. Also, inkjet printing allows for large-area printing for large posters or banners of a few square meters, for example.

Wiring formed by the inkjet printing method is dependent upon the amount of wiring material being printed, in terms of the widths of wiring patterns or spacing therebetween. Thus, the selection of the wiring material is an important issue. Of late, an inkjet printing method using metallic nanoparticles has been introduced, in which the metallic nanoparticles have a stable fine structure through a thermal process. Research is ongoing to achieve the optimized fine structure of metallic nanoparticles because the fine structure thereof affects the electrical and mechanical characteristics of metal wiring.

SUMMARY OF THE INVENTION

An aspect of the present invention provides a method of forming metal wiring using metallic nanoparticles, which can achieve superior electrical and mechanical characteristics by forming a stable fine structure.

According to an aspect of the present invention, there is provided a method of forming metal wiring, the method including: printing wiring using an ink composition including metallic nanoparticles and dispersants maintaining dispersion of the metallic nanoparticles; performing a first firing process of firing the wiring under vacuum or in an inert atmosphere to suppress grain growth; and performing a second firing process of firing the wiring with the vacuum or inert atmosphere released, to accelerate grain growth.

The metallic nanoparticles may be formed of a conductive material selected from the group consisting of gold, silver, copper, platinum, lead, indium, palladium, rhodium, ruthenium, iridium, osmium, tungsten, nickel, tantalum, bismuth, tartar, zinc, titanium, aluminum, cobalt, iron and a mixture thereof.

The metallic nanoparticles may have an average particle size of 500 nm or less.

The dispersants may be formed of a surfactant or a material forming a coordinate covalent bond with the metallic nanoparticles.

The printing of the wiring using the ink composition may use a screen method, an inkjet printing method, a gravure method, a spray coating method or an offset printing method.

The first firing process may be performed, raising the temperature to a temperature sufficient for the second firing process.

The second firing process may be performed at a temperature of 250° C. or less.

The method may further include performing a third firing process under a pressure of 5 MPa or higher after the second firing process. The third firing process may be performed at a temperature of 250° C. or less.

According to another aspect of the present invention, there is provided metal wiring formed by the method of forming metal wiring.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
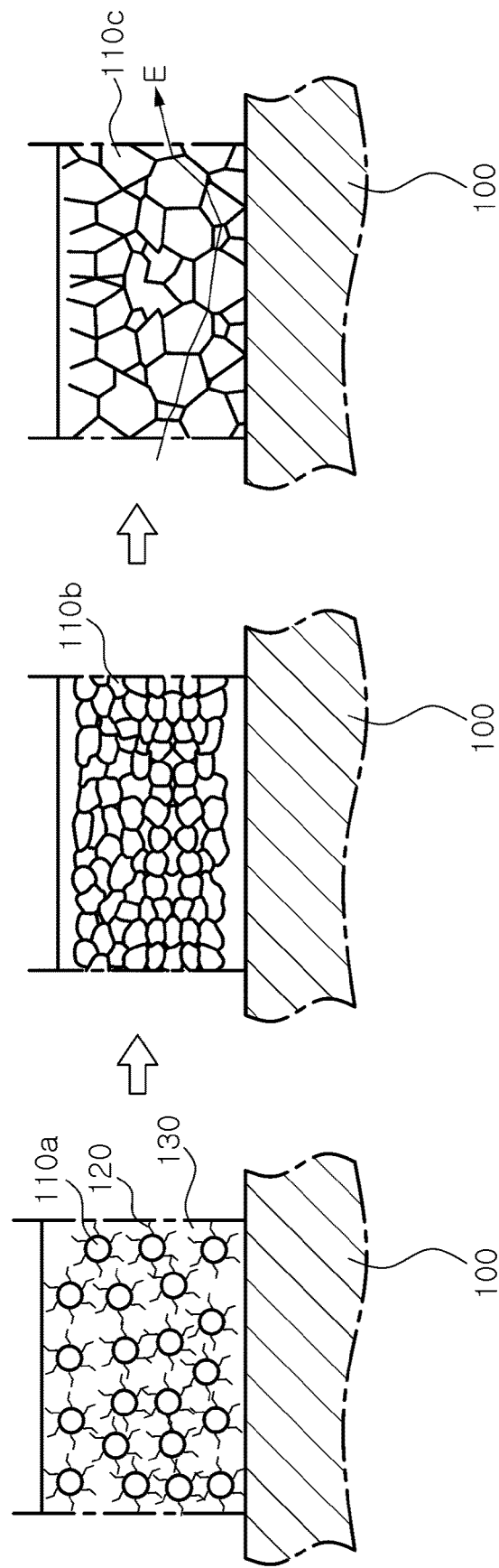
FIGS. 1A through 1C illustrate a related art process of forming metal wiring.

Exemplary embodiments of the present invention will now be described in detail with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity. Like reference numerals in the drawings denote like elements.

A method of forming metal wiring includes: printing wiring using an ink composition including metallic nanoparticles and dispersants maintaining dispersion of the metallic nanoparticles; performing a first firing process of firing the wiring under vacuum or in an inert atmosphere to suppress grain growth; and performing a second firing process of firing the wiring with the vacuum or inert atmosphere released, to accelerate grain growth.

An ink composition used for document printing contains chromophores expressing colors, and vehicles including the chromophores. In contrast, an ink composition used in forming a metallic thin film or metal wiring includes metallic nanoparticles as a functional material substituting the chromophores.

The metallic nanoparticles refer to particles with a particle size ranging from a few nanometers to hundreds of nanometers. Metallic particles, when reduced to the nanosize, bring about the 'nanosize effect'. The nanosize effect refers to changes in physical and chemical characteristics which occur when a normal material reaches the nanosize. For example, iron causing the nanosize effect has an insulation stress ratio 12 times higher than that of normal iron, and gold causing the nanosize effect has a melting point about half of that of normal gold.

In the case of metals, the nanosize effect is caused when the particle size is less than about 100 nm in general. In particular, this nanosize effect may occur to a significant extent when the particle size is about 50 nm or less, preferably about 10 nm or less. For example, the melting point of Ag is 961.9° C. The meting point of Ag begins to drop when the particle size of Ag reaches about 100 nm, and drops further to a range between 200° C. and 250° C. when the particle size becomes 10 nm or less.

By reducing the particle size sufficiently to the nanosize, the surface diffusion of metal atoms occurs to a considerable extent, resulting in grain boundary expansion. Therefore, a reduction in particle size to the nanosize lowers the melting point of the particles. Wiring, formed using metallic nanoparticles small enough to bring about the nanosize effect, is applicable even to a base material requiring low-temperature firing, such as an organic film or a plastic substrate.

The small sizes of nanoparticles increase surface energy, increasing a tendency toward grain cohesion. Therefore, a dispersant is attached in order to disperse metallic nanoparticles uniformly and stably in a solvent. This attachment of the dispersant means that the dispersant is absorbed on the surface of metallic nanoparticles by the medium of metal ions. The dispersant allows the metallic nanoparticles to be dispersed in a solvent stably. The dispersant and other additives are removed in the process of firing the nanoparticles.

After the firing process, the surfaces of the metal nanoparticles contact one another directly and form an aggregate, leading to the formation of one large bulk of the metallic nanoparticles. Wiring, formed in the above manner, has a high possibility of pore generation at the time of grain cohesion. Here, pores may cause a short circuit. Also, a large number of boundaries are present between the metallic nanoparticles, thus interrupting current flow, and thereby lowering electrical conductivity and reliability as well as impairing mechanical characteristics. According to the present invention, the electrical and mechanical characteristics are controlled by controlling the fine structure of metallic nanoparticles in the firing process.

FIGS. 1A through 1C illustrate the related art process of forming metal wiring.

FIG. 1A illustrates printing wiring on a substrate 100 with an ink composition. The ink composition includes metallic nanoparticles 110$a$ in a solvent 130, and dispersants 120 maintaining the dispersion of the metallic nanoparticles 110$a$. The metallic nanoparticles 110$a$ maintain their equilibrium in a colloidal state due to the dispersants 120.

Thereafter, a firing process is performed on the substrate 100 including the printed wiring. FIG. 1B illustrates the firing process. Referring to FIG. 1B, the solvent 130 and the dispersants 120 react with the air to thus separate from the wiring. As the dispersants 120, having served to prevent the bonding of the metallic particles, separate from the wiring, the metallic nanoparticles 110$b$ begin to clump. During the firing process, the dispersants 120 are reduced in amount, and the metallic nanoparticles undergo normal grain growth. FIG. 1C illustrates the state after the firing process. Referring to FIG. 1C, due to normal grain growth, the metallic nanoparticles 110$c$ form a porous fine structure which contains small-sized particles and a large number of pores. The porous fine structure impairs electrical reliability and mechanical characteristics. Also, the current flow E is interrupted by the large number of boundaries between the metallic nanoparticles.

Figure 2:
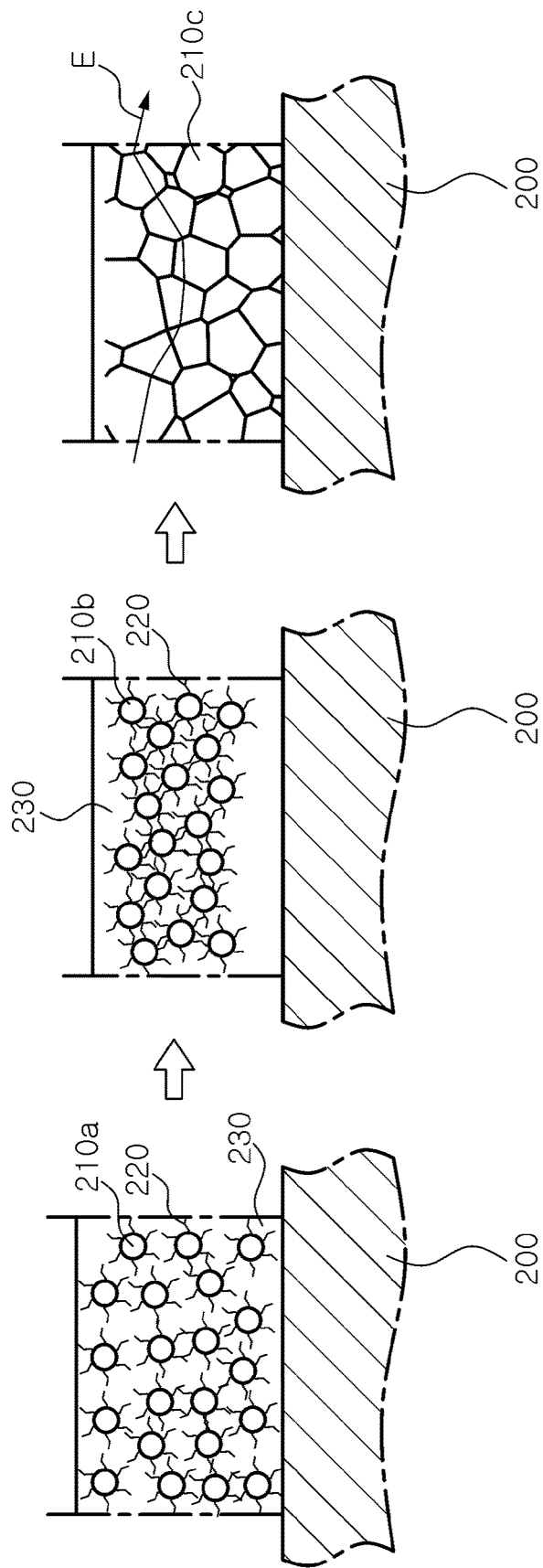
FIGS. 2A through 2C illustrate a process of forming metal wiring according to an exemplary embodiment of the present invention.

FIGS. 2A through 2C illustrate the process of forming metal wiring according to an exemplary embodiment of the present invention.

Referring to FIG. 2A, an ink composition includes metallic nanoparticles 210$a$ in a solvent 230, and dispersants 220 maintaining the dispersion of the metallic nanoparticles 210$a$. The metallic nanoparticles 210$a$ maintain a colloidal due to the dispersants 220. Wiring is printed on the substrate 200 using this ink composition.

The metallic nanoparticles 210$a$ contained in the ink composition are not particularly limited, provided that they are conductive materials. Examples of the conductive materials may include gold, silver, copper, platinum, lead, indium, palladium, rhodium, ruthenium, iridium, osmium, tungsten, nickel, tantalum, bismuth, tartar, zinc, titanium, aluminum, cobalt, iron and a mixture thereof. The metallic nanoparticles 210$a$ may utilize gold, silver, platinum, palladium, gold/platinum, palladium/silver, platinum/silver, platinum/palladium, or platinum/palladium/silver, or preferably, silver, platinum, or silver/palladium.

The shape of the metallic nanoparticles 210$a$ is not limited. The metallic nanoparticles 210$a$ may have a spherical shape, an ellipsoidal shape, a powder shape, an irregular shape, or a proper random shape.

The metallic nanoparticles 210$a$ may have an average size allowing the metallic nanoparticles 210$a$ to pass through a nozzle for forming fine wiring, without causing a blockage of the nozzle. The average size of the metallic nanoparticles 210$a$ may be 500 nm or less. The metallic nanoparticles 210$a$ may have an average size of 100 nm or less, and more preferably, be between 5 nm to 20 nm. The firing temperature may be determined according to the average size of the metallic nanoparticles 210$a$.

In order to prevent the clumping of the metallic nanoparticles 210$a$, the dispersants 220 are attached to the metallic nanoparticles 210$a$, and maintain the dispersion of the metallic nanoparticles 210$a$ in the solvent 230. The dispersants 220 may utilize a surfactant or a material forming a coordinate covalent bond with the metallic nanoparticles 210$a$. Examples of the material forming a coordinate covalent bond with metal atoms may include materials having lone electron pairs of nitrogen, sulfur or oxygen atoms, such as an amino group, a thiol group (—SH), a sulfide group (—S—), a hydroxy group (—OH), an oxy group (—O—), a carboxyl group (—COOH), or a cyano group (—CN) For example, the material may utilize a hydroxyamine such as ethanol amine; an amine-based compound such as oleylamine, polyethylenimine or polyvinylpyrollidon; an alcohol such as polyvinylalcohol; a glycol such as alkanethiol, dithiol, ethylene glycol, diethylene glycol or polyethylene glycol; polyacid such as polyacrylic acid, polymaleic acid, polymethylmethacrylic acid, poly (acrylic acid-co-methacrylic acid), poly(maleic acid-co-acrylic acid) or poly(acryl amid-co-acrylic acid); or carboxymethyl cellulose. The surfactant may utilize, for example, an anionic surfactant such as bis(2-ethylhexyl)sulfosuccinic acid or sodium dodecylbenzenesulfonic acid; a nonionic surfactant such as alkyl ester of alkyl glycol or akyl phenyl ester; a fluorinated surfactant; polyethylenimine; or a copolymer having polyethylene oxide.

The solvent 230 of the ink composition is not particularly limited, and may be a water-soluble solvent, an organic solvent, or a water-insoluble organic solvent. The water-soluble solvent may utilize an alcohol such as ethanol, methanol, propanol, isopropanol, 1-butanol, 2-butanol, isobutanol, hexanol, or octanol. The water-insoluble solvent may utilize a hydrocarbon-based material such as tetradecane, octadecane, heptadecane or toluene.

The substrate 200 on which metal wiring is printed is not particularly limited. As for the substrate 200, glass, polyimide, a polyethylene terephthalate (PET) film, a polyethylene naphthalate (PEN) film or polycarbonate may be used. The substrate is not particularly limited because the use of metallic nanoparticles allows for low-temperature firing.

A printing method using the ink composition is not specifically limited, but may utilize a screen method, an inkjet printing method, a gravure method, a spray coating method or an offset printing method. To form fine wiring, the inkjet printing method may be used.

Thereafter, a first firing process is performed under vacuum or in an inert atmosphere. FIG. 2B illustrates this first firing process. Referring to FIG. 2B, the first firing process allows the solvent 230 and the dispersants 220 to remain without separating from wiring in the state where the air, which may react with the solvent 230 and the dispersants 220, is blocked. Accordingly, the bonding of the metallic particles 210*b* is suppressed. That is, grain growth is suppressed by the dispersants 220 that serve to prevent bonding between the metallic particles 210*b*. The inert atmosphere may be an $N_2$ or an Ar atmosphere.

Subsequently, a second firing process is performed with the vacuum or inert atmosphere removed after the first firing process. As the vacuum or inert atmosphere is removed, the dispersants 230 promptly react with the air, separating from the wiring. This causes abnormal grain growth. FIG. 2C illustrates the second firing process. Referring to FIG. 2C, the metallic nanoparticles 210*c* form a coarse-grained structure containing large-sized particles due to the abnormal grain growth. This coarse-grained structure improves electrical reliability and mechanical characteristics. Also, a smooth current flow E is achieved because of a small number of boundaries between the metal nanoparticles.

The first firing process is performed, increasing the temperature for a predetermined period of time. That is, the first firing process may be understood as controlling the process of increasing the temperature to a proper temperature for the subsequent second firing process, in the vacuum or inert atmosphere.

The second firing process may be determined in due consideration of the sizes of the metallic nanoparticles and the characteristics of the substrate. The method of forming metal wiring according to the present invention may achieve a coarse-grained structure even in the case of performing low-temperature firing. The metal wiring formed according to the present invention, may have metallic particles with an average size on the microscale.

Although not shown, a third firing process may be performed under the pressure of 5 MPa or higher after the second firing process. The metallic particles are increased further in size after this firing process and bonding between the particles is enhanced. The third firing process may be performed at a temperature of 250° C. or less.

The method of forming metal wiring according to the present invention is not limited in use. For example, the method of forming metal wiring may be used for printed circuit boards (PCBs) such as double-faced or multilayer rigid PCBs, single or double-faced flexible PCBs, rigid-flexible PCBs, flexible PCBs and ceramic boards; rigid substrates for semiconductor mounting, such as IC-modules, plastic ball grid arrays (P-BGAs), chip scale packages (CSPs), enhanced BGAs, and flip chip BGAs (FC-BGAs); flexible substrates for semiconductor mounting, such as micro BGAs, fine pitch BGAs (FBGAs) and Tape BGAs (TBGAs); and substrates for semiconductor mounting, such as laminated multichip modules (MCM-L) and ceramic multichip modules (MCM-C). The method of forming the metal wiring according to the present invention may be used to fabricate a wiring board employing a polyimide film. The metal wiring, formed according to the present invention, includes metallic particles having an average particle size on the microscale and thus has excellent electrical and mechanical characteristics.

Embodiments

[Embodiment 1]

Figure 3:
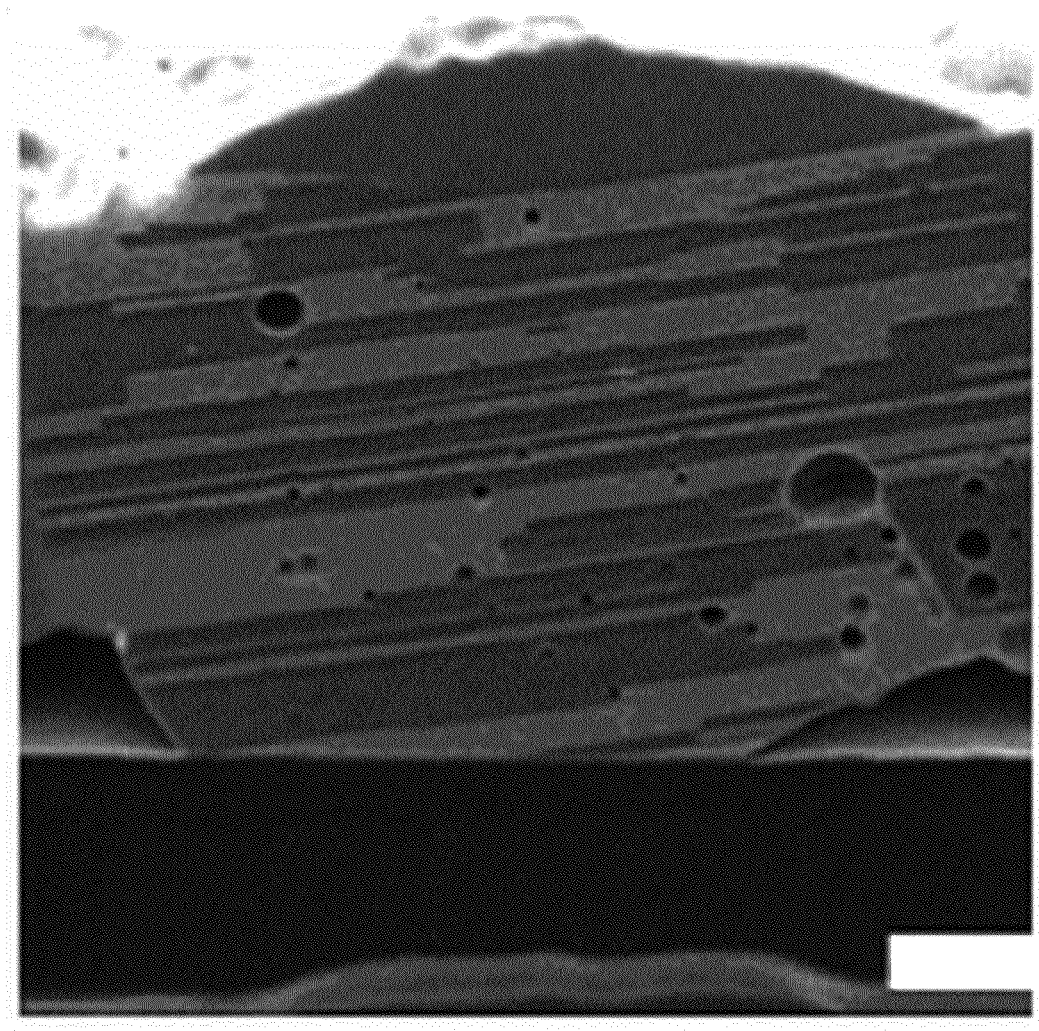
FIG. 3 is a scanning electron microscope (SEM) image showing the cross-section of metal wiring manufactured according to embodiment 1 of the present invention.

Metal wiring was printed on a substrate by an inkjet printing method, using ink containing Ag nanoparticles (40 wt %). A printing test piece was put into a vacuum oven and the temperature was increased up to 250° C. at a heating rate of 3° C./min in the vacuum state. Thereafter, air was introduced into the vacuum oven, and firing was performed at 250° C. for about two hours. FIG. 3 is an SEM image showing a cross-section of wiring obtained by the embodiment 1. As shown in FIG. 3, the metallic nanoparticles have a coarse-grained structure. Although pores are present due to the gasification of the dispersants within a film, the pores have no significant influence on electrical and mechanical characteristics because they are unconnected to one another. Specific resistance was calculated by measuring surface resistance using a surface measuring device (4 point probe), and then measuring thickness. The specific resistance was 5.32 $\mu\Omega\cdot cm$.

[Embodiment 2]

Figure 4A:
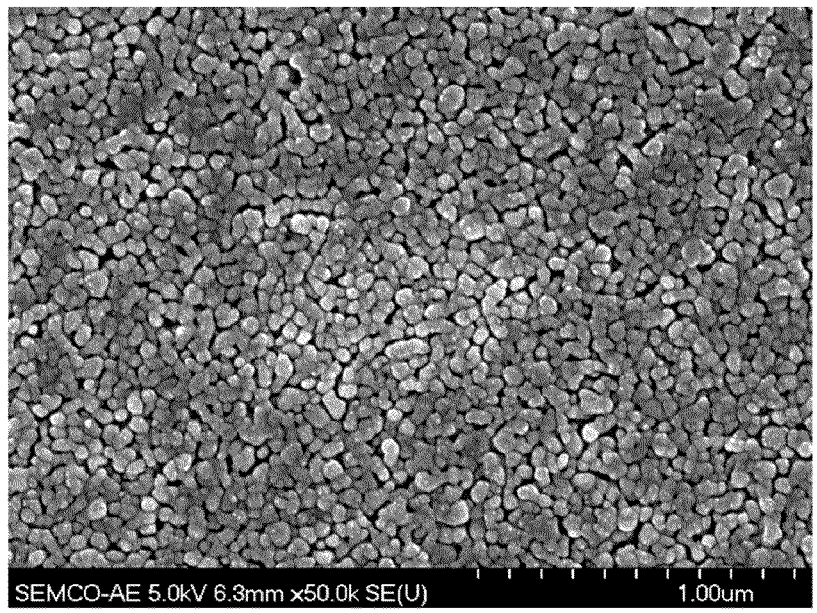
FIGS. 4A and 4B are SEM images showing the top of metal wiring according to embodiment 2 of the present invention.
Figure 4B:
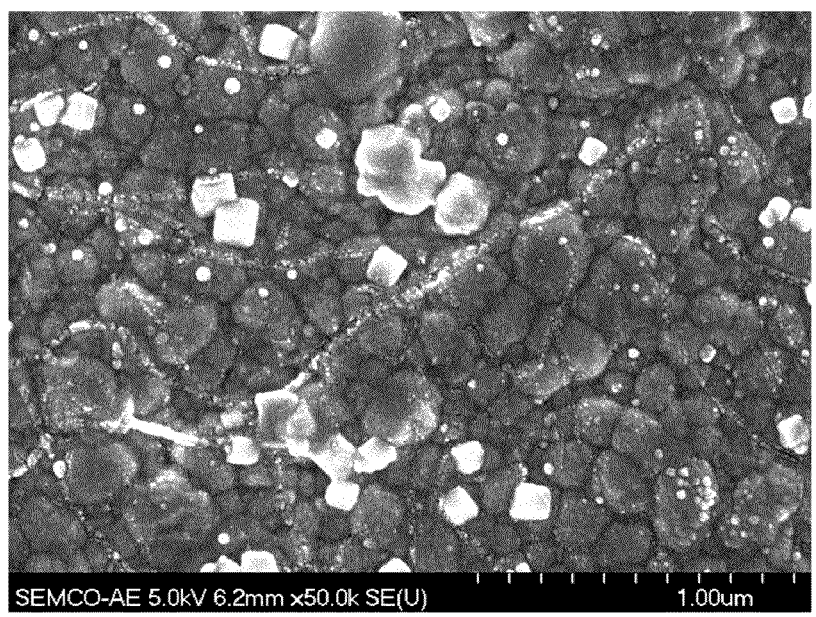

The printing test piece, fabricated by the above embodiment 1, was fired at 250° C. for about 30 minutes under a pressure of 5 Mpa or higher. FIGS. 4A and 4B are SEM images showing the top of wiring according to the embodiment 2. FIG. 4A is an image before firing, and FIG. 4B is an image after the firing. Referring to FIGS. 4A and 4B, the metallic nanoparticles increase in size, and bonding between the particles is enhanced. A result of measuring an elongation according to Japan industrial standard (JIS) showed that the elongation is increased from 1.4% to 2.8%.

COMPARATIVE EXAMPLE

Figure 5:
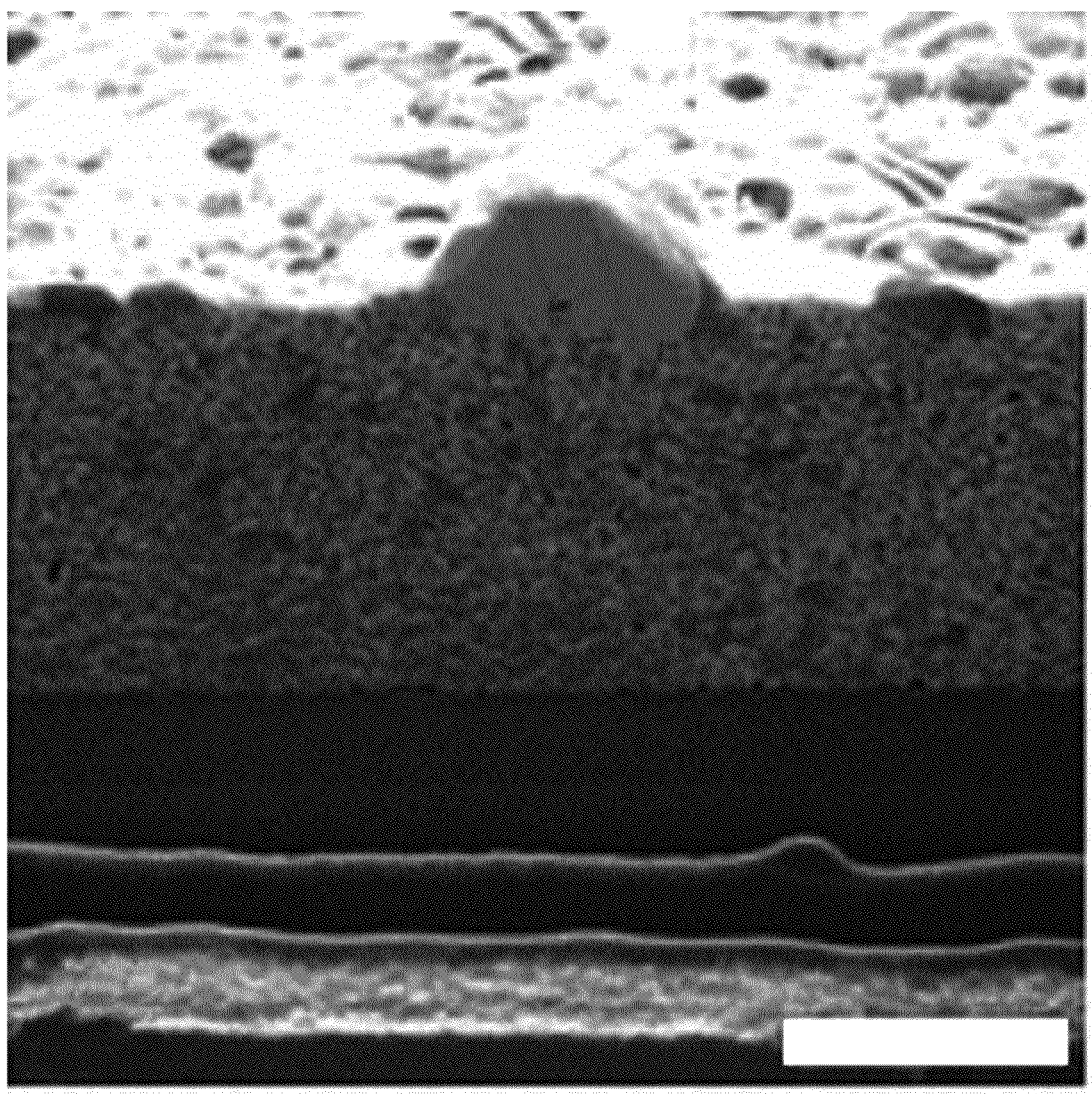
FIG. 5 is an SEM image showing the cross-section of metal wiring manufactured according to a comparative example.

Metal wiring was printed on a board with ink containing Ag nanoparticles (40 wt %) by an inkjet printing method. Thereafter, a firing process was performed at 250° C. for about two hours without atmosphere control. FIG. 5 is an SEM image showing the cross-section of wiring obtained by the comparative example. The structure depicted in FIG. 5 includes small-sized metallic nanoparticles and a large number of pores. The porous structure impairs electrical reliability and mechanical characteristics. Specific resistance was calculated by measuring surface resistance using a surface resistance measuring device (4 point probe), and measuring thickness. The specific resistance was 3.71 µΩ·cm.

As set forth above, according to exemplary embodiments of the invention, the method of forming metal wiring induces abnormal grain growth by rapidly removing dispersants, capable of inducing the growth of metallic nanoparticles, at a temperature at which the growth force of the metallic nanoparticles is high, in the process of firing the metallic nanoparticles. Accordingly, the metal wiring has a coarse-grained structure in which an average size of the metallic particles is large, and the electrical and mechanical characteristics thereof can be enhanced.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of forming metal wiring, the method comprising:
    printing wiring using an ink composition including metallic nanoparticles and dispersants maintaining dispersion of the metallic nanoparticles;
    performing a first firing process of firing the wiring under vacuum or in an inert atmosphere to suppress grain growth by keeping the dispersants from being removed during the first firing process; and
    performing a second firing process of firing the wiring with the vacuum or inert atmosphere released, to accelerate abnormal grain growth by removing the dispersants during the second firing process,
    wherein during the performing of the first firing process, a firing temperature is raised for a predetermined period of time.

2. The method of claim 1, wherein the metallic nanoparticles are formed of a conductive material selected from the group consisting of gold, silver, copper, platinum, lead, indium, palladium, rhodium, ruthenium, iridium, osmium, tungsten, nickel, tantalum, bismuth, tartar, zinc, titanium, aluminum, cobalt, iron and a mixture thereof.

3. The method of claim 1, wherein the metallic nanoparticles have an average particle size of 500 nm or less.

4. The method of claim 1, wherein the dispersants are formed of a surfactant or a material forming a coordinate covalent bond with the metallic nanoparticles.

5. The method of claim 1, wherein the printing of the wiring using the ink composition uses a screen method, an inkjet printing method, a gravure method, a spray coating method or an offset printing method.

6. The method of claim 1, wherein during the performing of the first firing process, the firing temperature is raised to a temperature sufficient for the second firing process.

7. The method of claim 1, wherein the second firing process is performed at a temperature of 250° C. or less.

8. The method of claim 1, further comprising performing a third firing process under a pressure of 5 MPa or higher after the second firing process.

9. The method of claim 8, wherein the third firing process is performed at a temperature of 250° C. or less.

* * * * *